(12) United States Patent
Yang et al.

(10) Patent No.: US 6,770,950 B2
(45) Date of Patent: Aug. 3, 2004

(54) NON-VOLATILE SEMICONDUCTOR MEMORY STRUCTURE

(75) Inventors: Ching-Song Yang, Chang-Hua Hsien (TW); Shih-Jye Shen, Hsinchu (TW); Ching-Hsiang Hsu, Hsinchu (TW)

(73) Assignee: eMemory Technology Inc., Hsin-Chu (TW)

( * ) Notice: Subject to any disclaimer, the term of this patent is extended or adjusted under 35 U.S.C. 154(b) by 218 days.

(21) Appl. No.: 10/099,801

(22) Filed: Mar. 13, 2002

(65) Prior Publication Data

US 2003/0173646 A1 Sep. 18, 2003

(51) Int. Cl.[7] .............................................. H01L 29/00
(52) U.S. Cl. ...................... 257/550; 257/314; 257/621; 257/928
(58) Field of Search ............................... 257/314, 550, 257/621, 928

(56) References Cited

U.S. PATENT DOCUMENTS 6,444,514 B1 * 9/2002 Nishimoto et al. ......... 438/221

2002/0074592 A1 * 6/2002 Abedifard ................. 257/315
2002/0185673 A1 * 12/2002 Hsu et al. .................. 257/314

FOREIGN PATENT DOCUMENTS

JP         05006971 A  *  1/1993  ......... H01L/27/092

* cited by examiner

Primary Examiner—Tom Thomas
Assistant Examiner—Matthew E. Warren
(74) Attorney, Agent, or Firm—Winston Hsu

(57) ABSTRACT

A non-volatile semiconductor memory cell structure and method of manufacture. The method includes the steps of forming a shallow first-type well layer, a second-type well layer and a deep first-type well layer over a substrate, forming stack gates over the shallow first-type well layer and finally forming source terminals and drain terminals. The source terminals penetrate through the shallow first-type well layer and connect with the second-type well layer. The drain terminals are close to the surface of the shallow first-type well layer. Both the source terminals and the drain terminals contain second type dopants.

10 Claims, 6 Drawing Sheets

NON-VOLATILE SEMICONDUCTOR MEMORY STRUCTURE

BACKGROUND OF THE INVENTION

1. Field of Invention

The present invention relates to a non-volatile semiconductor memory cell structure and method of manufacture. More particularly, the present invention relates to a flash memory cell structure and method of manufacture.

2. Description of Related Art

Non-volatile memory is used inside various electronic components for holding structural data, programming data or repeatedly accessed data. Non-volatile programmable memory such as electrically erasable programmable read-only-memory (EEPROM) is now routinely used inside personal computers and electronic equipment. A conventional EEPROM employs a floating gate transistor structure to write data into or erase data from a memory cell. However, erasure speed of this type of memory cell is relatively slow. Memory having a fast erasure speed, commonly referred to as flash memory, has now become a mainstream product in the market. In general, flash memory can be roughly divided into two major types, namely, NAND type and NOR type. In the NAND type flash memory, memory cells are connected in series by connecting a drain terminal of a previous memory cell with a source terminal of a following serial-connected memory cell. That is, the drain terminal of each of the NAND type memory cells is commonly using a same region of the source terminal of the following serial-connected memory cell. In the NOR type flash memory, a source region is commonly used by NOR type memory cells, for example 6. That is, the source terminals of the NOR type memory cells are connected to each other by the commonly used source region.

FIGS. 1 to 3 are cross-sectional views showing the steps for producing a conventional non-volatile semiconductor memory cell. First, as shown in FIG. 1, a substrate 100 is provided. A deep P-well layer 102, an N-well layer 104 and a channel-doped region 106 are formed over the substrate 100. The channel-doped region 106 is a p-doped region near the surface of the substrate 100. The N-well layer 104 is beneath the channel-doped region 106 and the deep P-well layer 102 is beneath the N-well layer 104.

As shown in FIG. 2, a stack gate 108 is formed over the channel-doped region 106. The stack gate 108 comprises of a first dielectric layer 108a, a floating gate 108b, a second dielectric layer 108c and a control gate 108d.

After the fabrication of the stack gate 108, ion implantation and heat drive-in processes are carried out to form a P-well 114, a source terminal 112 and a drain terminal 110 as shown in FIG. 3. The source terminal 112 and the drain terminal 110 are heavily N-doped (n$^+$) regions. The distribution of the source terminals localizes the channel-doped regions 106 into separate blocks such that each pair of stack gates 108 in a block uses a common drain terminal 110. The P-well 114 is under the drain terminal 110. Due to the heat drive-in process, the P-well 114 expands into regions under the stack gate 108 and overlaps with a portion of the channel-doped region 106.

In a conventional method of manufacturing non-volatile semiconductor memory cell, the distribution of dopants inside the channel-doped/P-well overlapping region underneath the stack gate is often laterally non-uniform. The variation in dopant concentration inside the channel-doped/P-well overlapping region will lead to threshold voltage deviation of memory cells.

In addition, the spread of the P-well region is often subjected to the effect caused by the thermal budget. If the P-well regions expand further towards the source terminals due to drive-in, the blocks normally localized by the source terminals may be too close or conduct leading to reliability problem for the memory cells.

SUMMARY OF THE INVENTION

Accordingly, one object of the present invention is to provide a non-volatile semiconductor memory cell structure and method of manufacture capable of improving the uniformity of dopant distribution inside a region underneath a stack gate structure of the memory cell.

A second object of this invention is to provide a non-volatile semiconductor memory cell structure and method of manufacture capable of improving the reliability of the memory cell.

To achieve these and other advantages and in accordance with the purpose of the invention, as embodied and broadly described herein, the invention provides a non-volatile semiconductor memory cell structure. The memory cell structure is built over a substrate. The substrate comprises of, from top to bottom, a shallow first-type well layer, a second-type well layer and a deep first-type well layer. A multiple-layered stack gate is over the substrate. The substrate further contains a multiple of source terminals and drain terminals. The source terminal and the drain terminal together form an adjacent pair. Each of the source terminal and the drain terminal is formed between a pair of stack gates. The source terminal has a depth great enough to pass through the shallow first-type well layer and connect with the second-type well layer. The drain terminal is close to the surface of the shallow first-type well layer. Both the source terminal and the drain terminal are second-type doped.

This invention also provides a method of fabricating a non-volatile semiconductor memory cell. The method includes the following steps. A deep first-type well layer, a second-type well layer and a shallow first-type well layer are sequentially formed over a substrate. A stack gate is formed over the shallow first-type doped well layer. A source terminal and a drain terminal is formed such that the source terminal passes through the shallow first-type well layer and connects with the second-type well layer and the drain terminal is formed close to the surface of the first-type well layer. Both the source terminal and the drain terminal are second-type doped.

In this invention, if the shallow first-type well layer and the deep first-type well layer are both P-doped layers, the second-type well layer, the source terminal and the drain terminal are N-doped layers. Conversely, if the shallow first-type well layer and the deep first-type well layer are both N-doped layers, the second-type well layer, the source terminal and the drain terminal are P-doped layers.

The stack gate of this invention may comprise of a first dielectric layer, a floating gate layer, a second dielectric layer and a control gate layer. The second dielectric layer, for example, is a three-layered oxide/nitride/oxide (ONO) structure.

Alternatively, the stack gate of this invention may comprise of a first dielectric layer, a trap layer, a second dielectric layer and a control gate layer. The first dielectric layer and the second dielectric layer can be oxide layers and the trap layer can be a silicon nitride layer. In other words, a three-layered oxide/nitride/oxide (ONO) structure is formed underneath the control gate.

The source terminal within the substrate comprises of a lightly doped section and a heavily doped section. The lightly doped section is close to the surface of the substrate while the heavily doped section is underneath the lightly doped section in connection with lightly doped section. Furthermore, the heavily doped section passes through the shallow first-type well layer and connects with the second-type well layer.

The source terminal that passes through the shallow first-type well layer is formed, for example, by performing a one-time ion implantation. By controlling implant depth of the ions, a lower dopant concentration is established near the surface of the substrate while a higher dopant concentration is established close to the junction between the second-type well layer and the shallow first-type well layer.

Alternatively, the source terminal that passes through the shallow first-type well layer is formed, for example, by performing more than one ion implantation. A first ion implantation is performed to form a lightly doped region near the surface of the substrate. A second ion implantation is performed to form a heavily doped region close to the junction between the second-type well layer and the shallow first-type well layer. The source terminal comprises the lightly doped region and the heavily doped region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
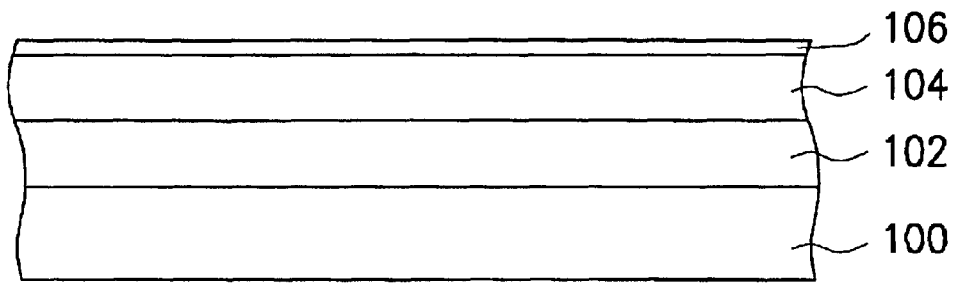
FIGS. 1 to 3 are schematic cross-sectional views showing the steps for producing a conventional non-volatile semiconductor memory cell.
Figure 2:
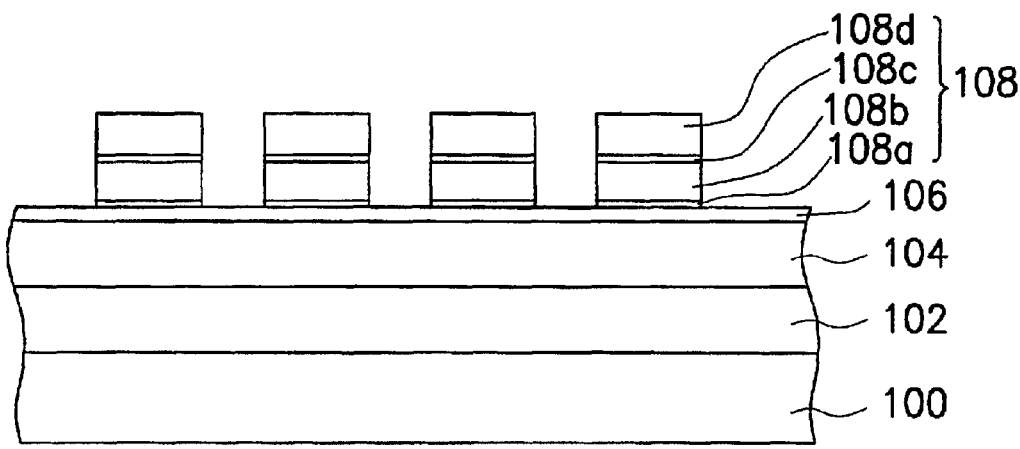

Reference will now be made in detail to the present preferred embodiments of the invention, examples of which are illustrated in the accompanying drawings. Wherever possible, the same reference numbers are used in the drawings and the description to refer to the same or like parts.

Figure 4:
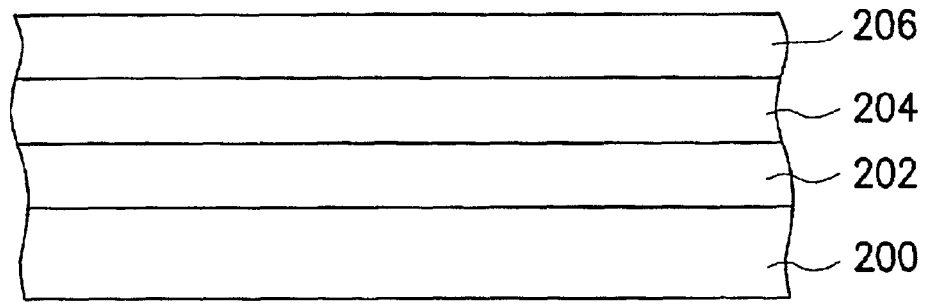
FIGS. 4 to 6 are schematic cross-sectional views showing the steps for producing a non-volatile semiconductor memory cell according to a first embodiment of this invention.
Figure 5:
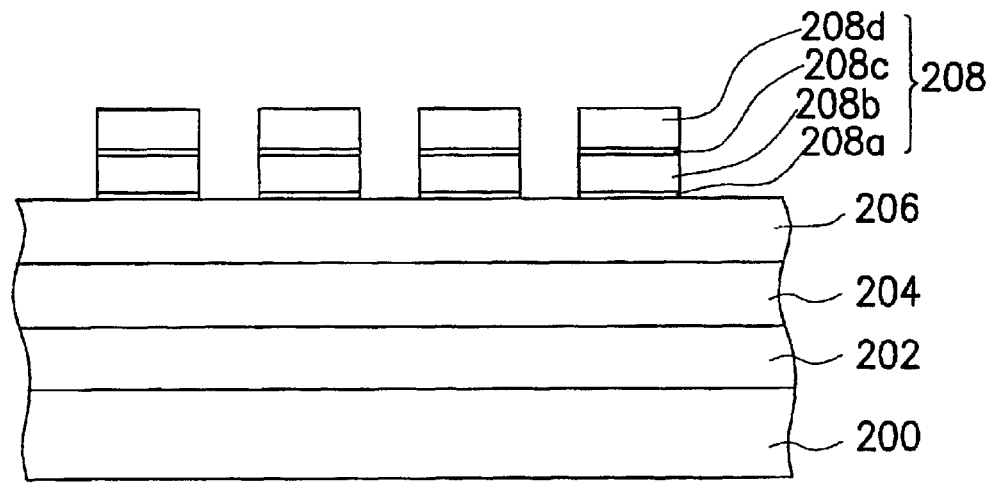
Figure 6:
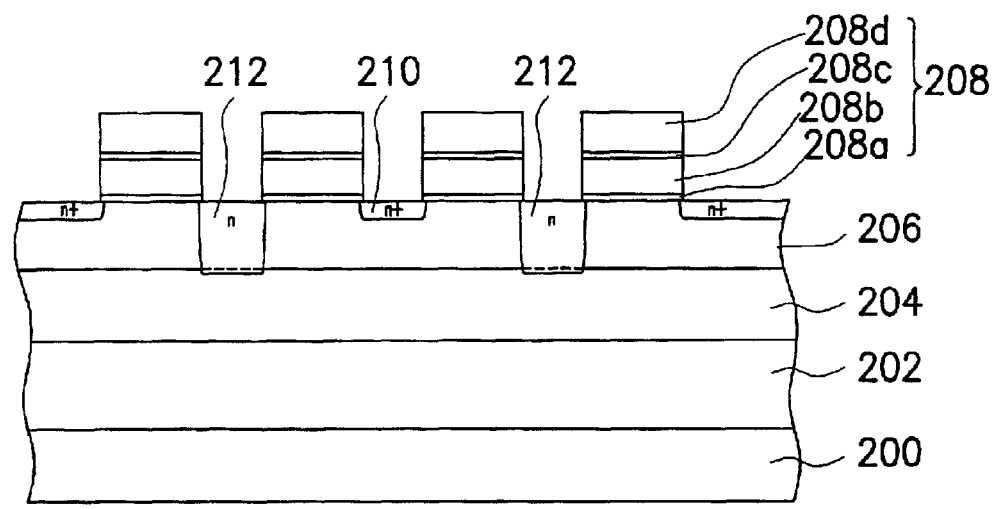

FIGS. 4 to 6 are schematic cross-sectional views showing the steps for producing a non-volatile semiconductor memory cell according to a first embodiment of this invention. As shown in FIG. 4, a substrate is provided. The substrate 200 can be a second-type-doped layer, for example. A deep first-type well layer 202, a second-type well layer 204 and a shallow first-type well layer 206 are sequentially formed over the substrate 200. The dopants in both the substrate 200 and the second-type well layer 204 are N-type dopants and the dopants in both the deep first-type well layer 202 and the shallow first-type well layer 206 are P-type dopants, for example. In addition, the shallow first-type well layer 206 is close to the surface of the substrate 200. The second-type well layer 204 is underneath the shallow first-type well layer 206 and the deep first-type well layer 202 is underneath the second-type well layer 204.

As shown in FIG. 5, a stack gate 208 is formed over the shallow first-type well layer 206. The stack gate 208, for example, includes a first dielectric layer 208a, a floating gate 208b, a second dielectric layer 208c and a control gate 208d. The first dielectric layer 208a can be, for example, a silicon oxide layer. The second dielectric layer 208c can be, for example, an oxide/nitride/oxide (ONO) composite layer. The floating gate 208b and the control gate 208d can be, for example, polysilicon layers. In the fabrication of the stack gate 208, the floating gate 208b and the control gate 208d are patterned differently. Hence, the first dielectric layer 208a and the floating gate 208b are patterned using a first mask while the second dielectric layer 208c and the control gate 208d are patterned using a second mask.

After complete fabrication of stack gate 208, a source terminal 212 and a drain terminal 210 are formed as shown in FIG. 6. The source terminal 212 and the drain terminal 210 are formed, for example, by conducting an ion implant followed by a drive-in operation. The source terminal 212 and the drain terminal 210 are regions with a high concentration of second-type dopants, for example. The source terminal 212 has a depth great enough to localize the shallow first-type well layer 206 into separate blocks and the two stack gates 208 on each block uses a common drain terminal 210.

The source terminal 212 is formed, for example, by performing an ion implantation and controlling the implantation depth to a region close to the junction between the shallow first-type well layer 206 and the second-type well layer 204. Thereafter, a drive-in operation is performed to form the source terminal 212. By controlling the depth of implantation, the source terminal 212 has a dopant concentration that varies with depth. The region closer to the surface of the shallow first-type well layer 206 has a lower concentration of dopants and the region closer to the junction between the shallow first-type well layer 206 and the second-type well layer 204 has a higher concentration of dopants. Such distribution of dopants inside the source terminal 212 reduces the amount of disturbances during memory programming.

Figure 3:
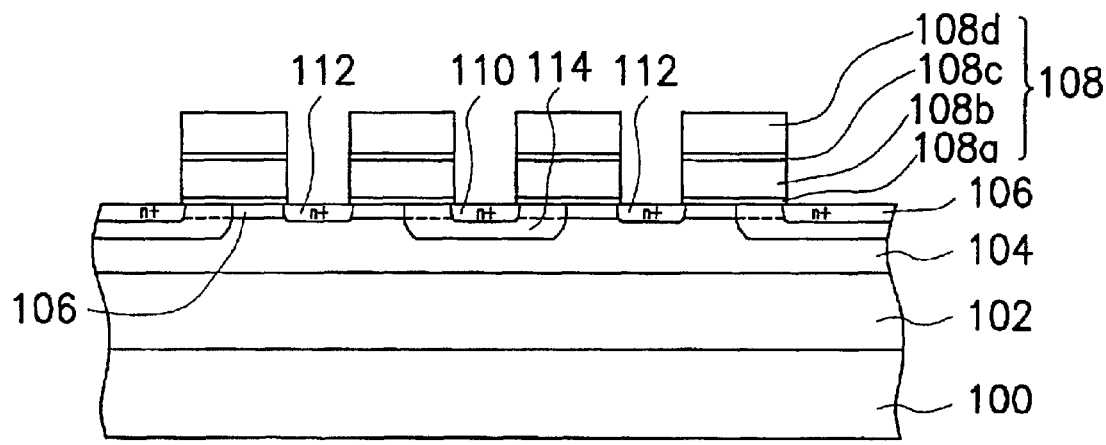

In the first embodiment, the shallow first-type well layer 206 replaces the conventional channel-doped region 106 and the P-well layer 114 (shown in FIG. 3). Since a highly uniform distribution of dopants underneath the stack gates 208 can be created inside the shallow first-type well layer 206 by controlling the implantation process, problem arising from non-uniformity of dopant concentration is eliminated. Furthermore, in this embodiment, the shallow first-type well layer 206 is formed before creating a concentration gradient of dopants with depth so that the shallow first-type well layer 206 and the source terminal 212 are localized. Hence, bridging between neighboring memory cell due to drive-in is prevented.

The first-type dopants and the second type dopants, for example, may be P-type dopants and N-type dopants respectively. In the illustration provided by the second embodiment, both the source terminal and drain terminal are N-doped regions. However, the actual configuration should not be limited as such because identical function will result if the first-type dopants are N-type dopants and the second-type dopants are P-type dopants.

Figure 7:
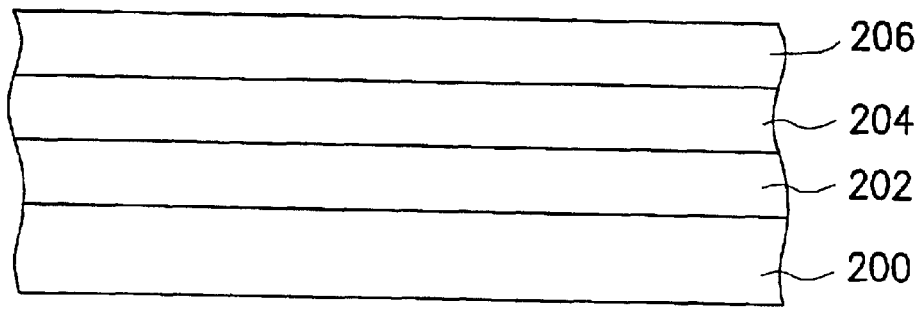
FIGS. 7 to 9 are schematic cross-sectional views showing the steps for producing a non-volatile semiconductor memory cell according to a second embodiment of this invention.
Figure 8:
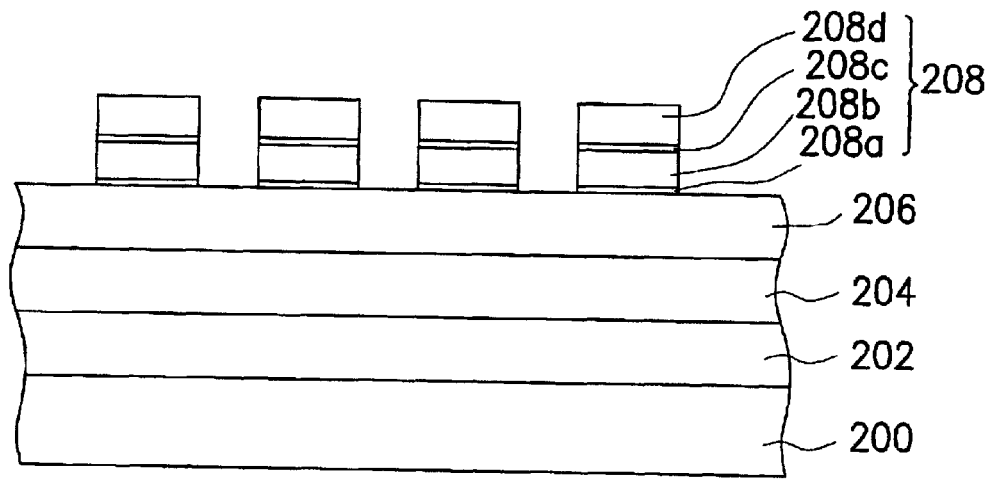
Figure 9:
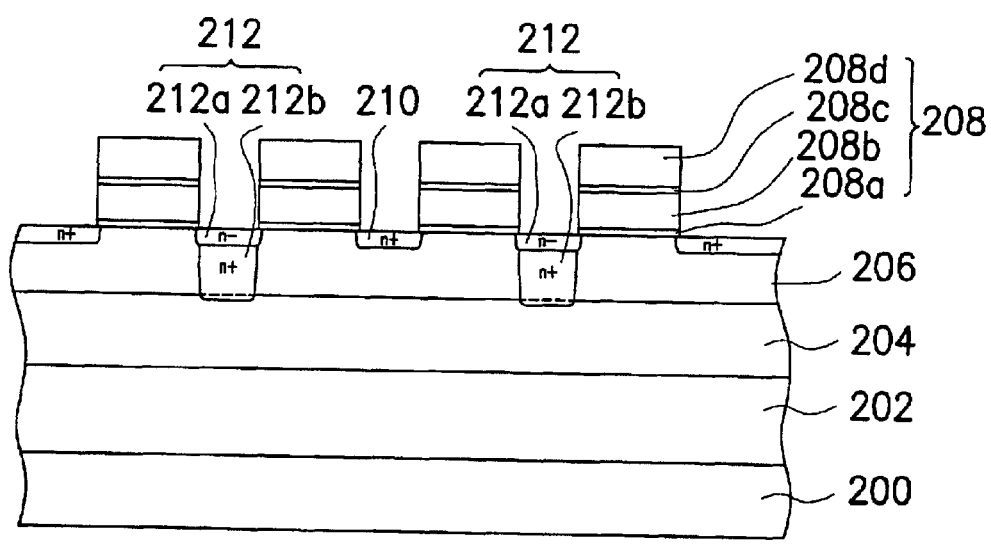

FIGS. 7 to 9 are schematic cross-sectional views showing the steps for producing a non-volatile semiconductor memory cell according to a second embodiment of this invention. As shown in FIG. 7, a substrate is provided. The substrate 200 can be a second-type-doped layer, for example. A deep first-type well layer 202, a second-type well layer 204 and a shallow first-type well layer 206 are sequentially formed over the substrate 200. The dopants in both the substrate 200 and the second-type well layer 204 are N-type dopants and the dopants in both the deep first-type well layer 202 and the shallow first-type well layer 206 are P-type dopants, for example. In addition, the shallow first-type well layer 206 is close to the surface of the substrate 200. The second-type well layer 204 is underneath the shallow first-type well layer 206 and the deep first-type well layer 202 is underneath the second-type well layer 204.

As shown in FIG. 8, a stack gate 208 is formed over the shallow first-type well layer 206. The stack gate 208, for example, includes a first dielectric layer 208a, a floating gate 208b, a second dielectric layer 208c and a control gate 208d. The first dielectric layer 208a can be, for example, a silicon oxide layer. The second dielectric layer 208c can be, for example, an oxide/nitride/oxide (ONO) composite layer. The floating gate 208b and the control gate 208d can be, for example, polysilicon layers. In the fabrication of the stack gate 208, the floating gate 208b and the control gate 208d are patterned differently. Hence, the first dielectric layer 208a and the floating gate 208b are patterned using a first mask while the second dielectric layer 208c and the control gate 208d are patterned using a second mask.

After complete fabrication of stack gate 208, a source terminal 212 and a drain terminal are formed as shown in FIG. 9. The source terminal 212 and the drain terminal 210 are formed, for example, by performing an ion implant followed by a drive-in operation. The source terminal 212 and the drain terminal 210 are regions with a high concentration of second-type dopants, for example. The source terminal 212 has a depth great enough to localize the shallow first-type well layer 206 into separate blocks and the two stack gates 208 on each block uses a common drain terminal 210.

The source terminal 212 can be formed, for example, by performing a number of ion implantation. To form the source terminal 212, two implant operations are carried out in sequence. In the first ion implant operation, implant depth is controlled to a region close to the surface of the shallow first-type well layer 206. In the second ion implant operation, implant depth is controlled to a region close to the junction between the shallow first-type well layer 206 and the second-type well layer 204. Thereafter, a drive-in operation is performed to form the source terminal 212 that includes a lightly doped region 212a and a heavily doped region 212b inside the substrate 200.

In the second embodiment, ions are implanted into the substrate to a different depth level in two separate implant operations to form the lightly doped region 212a and the heavily doped region 212b. The distribution of dopants in the lightly doped region 212a and the heavily doped region 212b inside the source terminal 212 also reduces the amount of disturbances in the memory cell during memory programming.

The first-type dopants and the second type dopants, for example, may be P-type dopants and N-type dopants respectively. In the illustration provided by the second embodiment, both the source terminal and drain terminal are N-doped regions. However, the actual configuration should not be limited as such because identical function will result if the first-type dopants are N-type dopants and the second-type dopants are P-type dopants.

Figure 10:
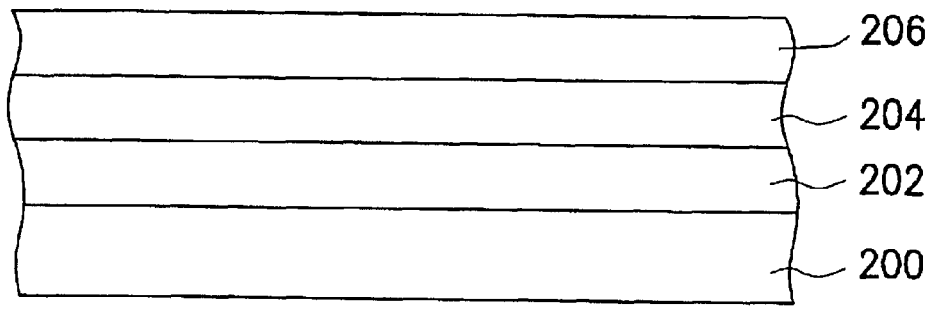
FIGS. 10 to 12 are schematic cross-sectional views showing the steps for producing a non-volatile semiconductor memory cell according to a third embodiment of this invention.
Figure 11:
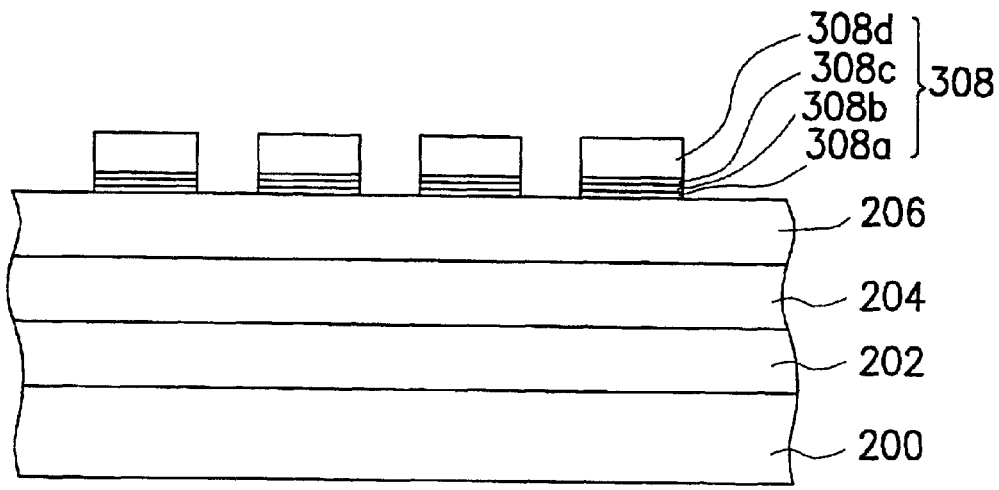
Figure 12:
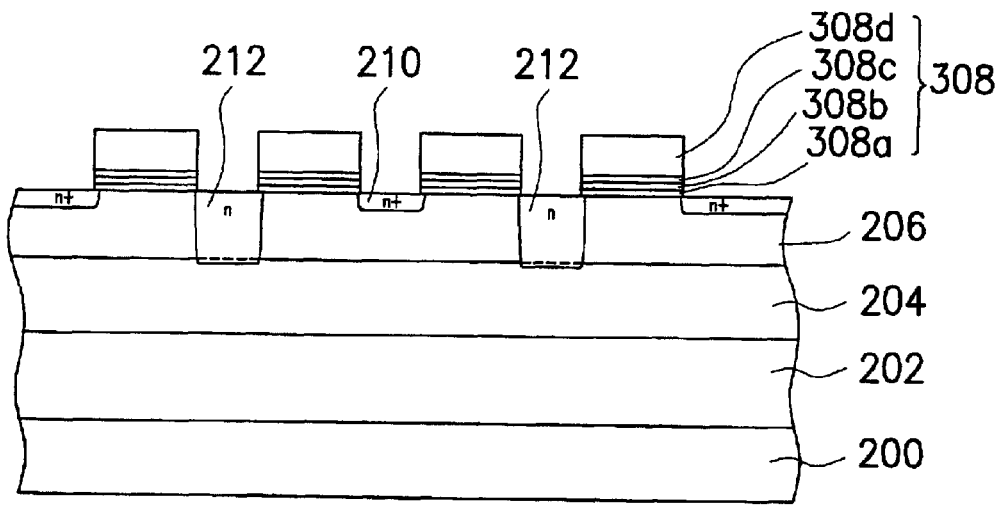

FIGS. 10 to 12 are schematic cross-sectional views showing the steps for producing a non-volatile semiconductor memory cell according to a third embodiment of this invention. The third embodiment is very similar in many aspects to the first embodiment of this invention. One major difference lies in the stack gate 308 above the substrate 200. The stack gate 308 comprises of a first dielectric layer 308a, a trap layer 308b, a second dielectric layer 308c and a control gate layer 308d. The first dielectric layer 308a, the trap layer 308b, the second dielectric layer 308c and the control gate layer 308d are sequentially formed on the shallow first-type well layer 206. The first dielectric layer 308b and the second dielectric layer 308c are, for example, silicon oxide layers. The trap layer 308b is, for example, a silicon nitride layer so that the first dielectric layer 308a, the trap layer 308b and the second dielectric layer 308c together form an oxide/nitride/oxide (ONO) composite layer. The control gate layer 208d is, for example, a polysilicon layer. In the process of fabricating the stack gate 308, since the trap layer 308b is a non-conductive layer, the first dielectric layer 308a, the trap layer 308b, the second dielectric layer 308c and the control gate 308d are patterned together. In other words, the first dielectric layer 308a, the trap layer 308b, the second dielectric layer 308c and the control gate layer 308d are formed together using a single mask.

The modification of stack gate 308 structure facilitates a further drop in the operating voltage and power and simplifies the manufacturing process. In addition, the shallow first-type well layer 206 together with the source terminal 212 structure with a depth long enough to localize the shallow first-type well layer 212 further boost the reliability of each memory cell.

Figure 13:
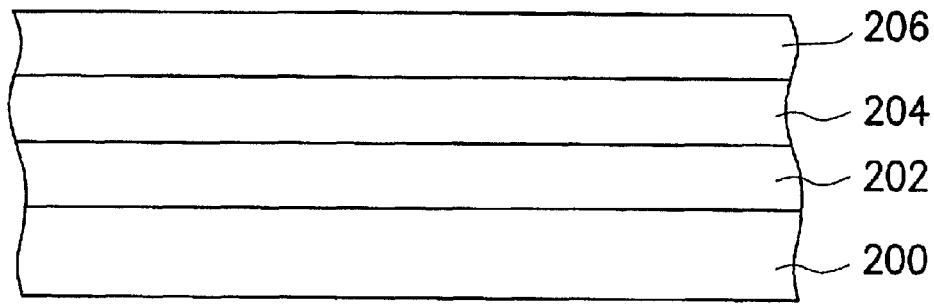
FIGS. 13 to 15 are schematic cross-sectional views showing the steps for producing a non-volatile semiconductor memory cell according to a fourth embodiment of this invention.
Figure 14:
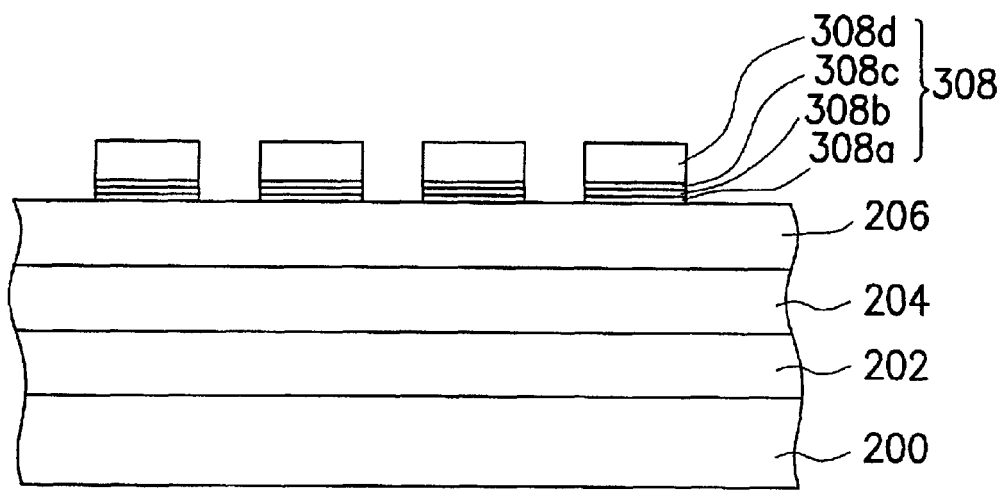
Figure 15:
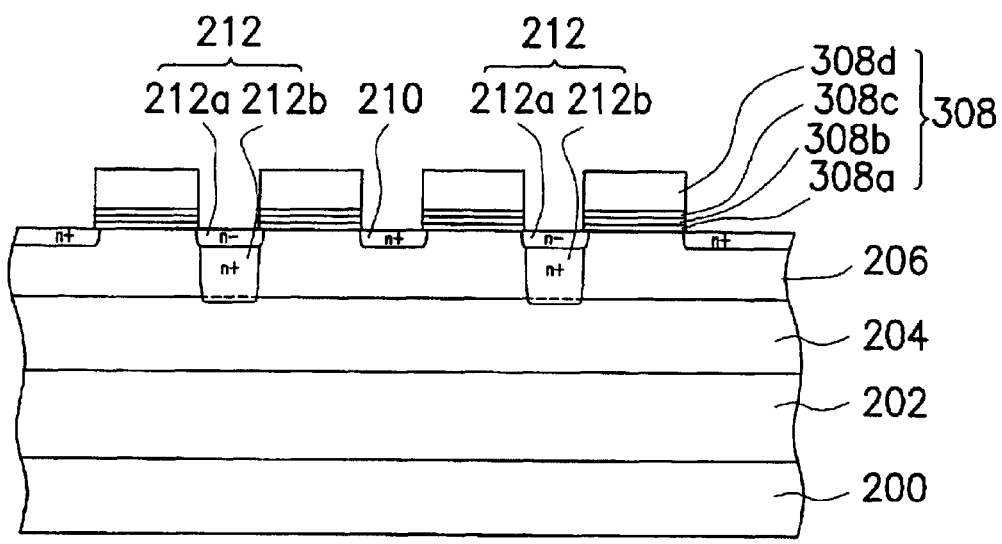

FIGS. 13 to 15 are schematic cross-sectional views showing the steps for producing a non-volatile semiconductor memory cell according to a fourth embodiment of this invention. The fourth embodiment is very similar in many aspects to the second embodiment of this invention. One major different lies in the stack gate 308 above the substrate 200. The stack gate 308 comprises of a first dielectric layer 308a, a trap layer 308b, a second dielectric layer 308c and a control gate layer 308d. The first dielectric layer 308a, the trap layer 308b, the second dielectric layer 308c and the control gate layer 308d are sequentially formed on the shallow first-type well layer 206. The first dielectric layer 308b and the second dielectric layer 308c are, for example, silicon oxide layers. The trap layer 308b is, for example, a silicon nitride layer so that the first dielectric layer 308a, the trap layer 308b and the second dielectric layer 308c together form an oxide/nitride/oxide (ONO) composite layer. The control gate layer 208d is, for example, a polysilicon layer. In the process of fabricating the stack gate 308, since the trap layer 308b is a non-conductive layer, the first dielectric layer 308a, the trap layer 308b, the second dielectric layer 308c and the control gate 308d are patterned together. In other words, the first dielectric layer 308a, the trap layer 308b, the second dielectric layer 308c and the control gate layer 308d are formed together using a single mask.

The modification of stack gate 308 structure facilitates a further drop in the operating voltage and power and simplifies the manufacturing process. In addition, the shallow first-type well layer 206 together with the source terminal 212 consisting of the lightly doped region 212a and the heavily doped region 212b further improves the reliability of each memory cell.

Figure 16:
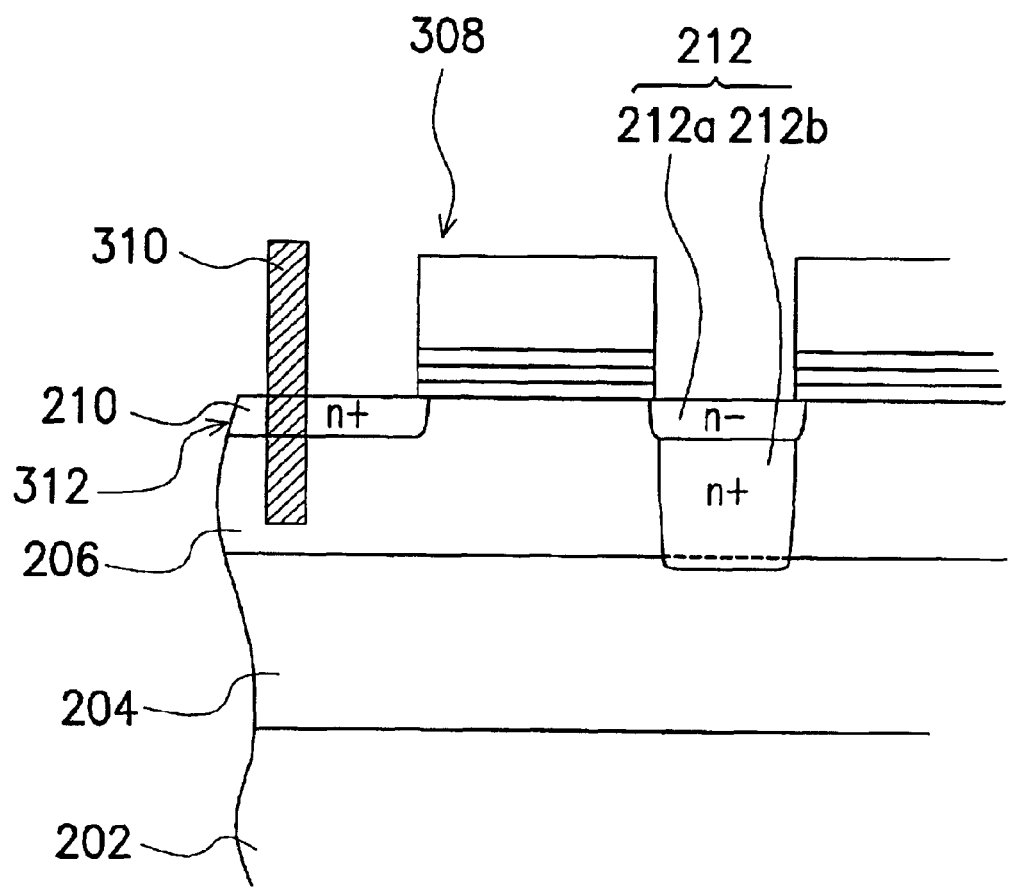
FIG. 16 shows a short-circuited structure in the drain side of the cell.

In addition, the cell structure can be further modified as shown in FIG. 16. FIG. 16 shows a short-circuited structure in the drain side of the cell. As shown, the drain terminal 210 and the shallow first type well layer 206 are short together as a bit line structure. There are several method to form the bit line structure. For example, the drain terminal 210 and the shallow first type well layer 206 shorted by a metal contact 310 that penetrates through a junction 312 between the drain terminal 210 and the shallow first type well layer 206. Alternatively, the drain terminal 210 and the shallow first type well layer 206 can be shorted by a metal contact 310 across an exposed surface of the drain terminal 210 and the shallow first type well layer 206.

In summary, the non-volatile semiconductor memory cell structure and manufacturing method have the following advantages:

1. The P-well layer and the channel-doped region in a conventional cell structure are integrated together to form a shallow P-well layer so that non-uniformity of the P-doped layer underneath the stack gate is prevented.

2. The shallow P-well layer used in this invention prevents conduction problem associated with a conventional P-well structure.

3. By replacing the steps for producing the P-well layer and the channel-doped region of a conventional cell, the manufacturing process is simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile semiconductor memory cell structure, comprising:

a substrate having a shallow first-type well layer, a second-type well layer and a deep first-type well layer, wherein the deep first-type well layer is at a greater depth than the shallow first-type well layer and the second-type well layer is between the shallow first-type well layer and the deep first-type well layer;

a plurality of stack gates above the shallow first-type well layer of the substrate; and a plurality of source terminals and drain terminals between the stack gates, wherein depth of the source terminal is long enough to pass through the shallow first-type well layer and connect with the second-type well layer, and both the source terminals and the drain terminals are second-type-doped regions; wherein each source terminal further includes:

a lightly doped region close to the substrate surface; and a heavily doped region underneath the lightly doped region but in connection with the lightly doped region such that the heavily doped region passes through the shallow first-type well layer in connection with the second-type well layer;

wherein both the lightly doped region and the heavily doped region are second-type-doped regions with a dopant concentration greater in the heavily doped region than the lightly doped region.

2. The memory cell structure of claim 1, wherein the shallow first-type well layer and the deep first-type well layer are P-doped layers and the second-type well layer, the source terminals and the drain terminals are N-doped layers.

3. The memory cell structure of claim 1, wherein the shallow first-type well layer and the deep first-type well layer are N-doped layers and the second-type well layer, the source terminals and the drain terminals are P-doped layers.

4. The memory cell structure of claim 1, wherein each stack gate further includes:

a first dielectric layer over the substrate;

a floating gate over the first dielectric layer;

a second dielectric layer over the floating gate; and a control gate over the second dielectric layer.

5. The memory cell structure of claim 4, wherein the second dielectric layer includes an oxide/nitride/oxide composite layer.

6. The memory cell structure of claim 1, wherein each stack gate includes:

a first dielectric layer over the substrate;

a trap layer over the first dielectric layer;

a second dielectric layer over the trap layer; and a control gate over the second dielectric layer.

7. The memory cell structure of claim 6, wherein the first dielectric layer and the second dielectric layer are silicon oxide layers and the trap layer is a silicon nitride layer.

8. The memory cell structure of claim 1, wherein the drain terminal and the shallow first type well layer are shorted.

9. The memory cell structure of claim 8, wherein a metal contact penetrates through a junction between the drain terminal and the shallow first type well layer so that the drain terminal and the shallow first type well layer are shorted.

10. The memory cell structure of claim 8, wherein the a metal contact is located to butt an exposed surface of the drain terminal and the shallow first type well layer so that the drain terminal and the shallow first type well layer are shorted.

* * * * *